(12) United States Patent
Tsuchiyama et al.

(10) Patent No.: US 12,733,183 B2
(45) Date of Patent: Sep. 8, 2026

(54) SEMICONDUCTOR DEVICE HAVING CHIP CAPACITOR CONNECTED TO SEMICONDUCTOR CHIP WITH WIRES

(71) Applicant: RENESAS ELECTRONICS CORPORATION, Tokyo (JP)

(72) Inventors: Kazuaki Tsuchiyama, Tokyo (JP); Tatsuaki Tsukuda, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 408 days.

(21) Appl. No.: 18/479,327

(22) Filed: Oct. 2, 2023

(65) Prior Publication Data

US 2024/0164118 A1 May 16, 2024

(30) Foreign Application Priority Data

Nov. 14, 2022 (JP) ................................ 2022-181925

(51) Int. Cl.
*H10B 80/00* (2026.01)
*H10W 90/00* (2026.01)
*H10W 72/00* (2026.01)
(Continued)

(52) U.S. Cl.
CPC ............ *H10B 80/00* (2023.02); *H10W 90/00* (2026.01); *H10W 72/073* (2026.01); *H10W 72/07341* (2026.01); *H10W 72/07352* (2026.01); *H10W 72/07354* (2026.01); *H10W 72/075* (2026.01); *H10W 72/07554* (2026.01); *H10W 72/327* (2026.01); *H10W 72/347* (2026.01);
(Continued)

(58) Field of Classification Search
CPC ......... H10B 80/00; H01L 24/05; H01L 24/06; H01L 24/32; H01L 24/33; H01L 24/45; H01L 24/48; H01L 24/49; H01L 24/73; H01L 24/83; H01L 24/92; H01L 25/16; H10W 90/00; H10W 90/753
See application file for complete search history.

(56) References Cited

U.S. PATENT DOCUMENTS 7,233,065 B2 6/2007 Watanabe et al.
2010/0123215 A1* 5/2010 Pan .................... H01L 23/5286 257/532

(Continued)

FOREIGN PATENT DOCUMENTS

JP 2002-184933 A 6/2002
JP 2011-124604 A 6/2011

*Primary Examiner* — Michael Jung
(74) *Attorney, Agent, or Firm* — Rimon P.C.

(57) ABSTRACT

A semiconductor device includes: a base material having a first terminal; a semiconductor chip having a first electrode pad electrically connected with the first terminal, a second electrode pad to which a power supply potential is to be supplied, and a third electrode pad to which a reference potential is to be supplied, and mounted on the base material via a first member; a chip capacitor having a first electrode and a second electrode, and mounted on the semiconductor chip via a second member; a first wire electrically connecting the first electrode pad with the first terminal; a second wire electrically connecting the second electrode pad with the first electrode without going through the base material; and a third wire electrically connecting the third electrode pad with the second electrode without going through the base material.

9 Claims, 11 Drawing Sheets

(51) Int. Cl.
*H10W 72/30* (2026.01)
*H10W 72/50* (2026.01)
*H10W 72/90* (2026.01)

(52) U.S. Cl.
CPC ...... *H10W 72/5449* (2026.01); *H10W 72/547* (2026.01); *H10W 72/5522* (2026.01); *H10W 72/5524* (2026.01); *H10W 72/5525* (2026.01); *H10W 72/865* (2026.01); *H10W 72/884* (2026.01); *H10W 72/932* (2026.01); *H10W 72/9445* (2026.01); *H10W 90/734* (2026.01); *H10W 90/738* (2026.01); *H10W 90/752* (2026.01); *H10W 90/753* (2026.01); *H10W 90/754* (2026.01); *H10W 90/756* (2026.01); *H10W 90/758* (2026.01); *H10W 90/759* (2026.01)

(56) References Cited

U.S. PATENT DOCUMENTS

| | | | | |
|---|---|---|---|---|
| 2012/0068306 | A1* | 3/2012 | Song | H10D 1/692 257/532 |
| 2014/0252551 | A1* | 9/2014 | Dix | H10D 1/68 257/532 |
| 2017/0162490 | A1* | 6/2017 | Katsumura | H01L 23/3114 |
| 2019/0312005 | A1* | 10/2019 | Pon | H01L 24/48 |
| 2020/0168530 | A1* | 5/2020 | Male | H01L 23/49805 |
| 2021/0327831 | A1* | 10/2021 | Ha | H01L 24/48 |
| 2022/0302076 | A1* | 9/2022 | Iida | H01L 24/48 |
| 2023/0005897 | A1* | 1/2023 | Kanda | H10F 30/20 |
| 2023/0089615 | A1* | 3/2023 | Agawa | H01L 24/73 257/532 |

* cited by examiner

32
DRAM chip
41
C3
42
C2
C4
C1
VDD
VDDQ
VSSQ/VSS
31
311
VSS
D
VSSQ
logic chip
1a 1a

SEMICONDUCTOR DEVICE HAVING CHIP CAPACITOR CONNECTED TO SEMICONDUCTOR CHIP WITH WIRES

CROSS-REFERENCE TO RELATED APPLICATIONS

The disclosure of Japanese Patent Application No. 2022-181925 filed on Nov. 14, 2022, including the specification, drawings and abstract is incorporated herein by reference in its entirety.

BACKGROUND

The present disclosure relates to a semiconductor device. Here, there are disclosed techniques listed below.

[Patent Document 1] Japanese Unexamined Patent Application Publication No. 2002-184933

[Patent Document 2] Japanese Unexamined Patent Application Publication No. 2011-124604

Patent Document 1 and Patent Document 2 disclose a semiconductor device having a main surface of a semiconductor chip, namely, an electrode pad forming surface on which a chip capacitor is mounted. The chip capacitor is provided between the power supply potential and the reference potential, and operates as a bypass capacitor.

SUMMARY

It is required to reduce a target impedance (also referred to as a power supply impedance) of a power supply in accordance with the increasement of the speed of a semiconductor device. For example, in DDR4 SDRAM (Double Data Rate 4 Synchronous Dynamic Random Access Memory), the data transfer rate may be higher than or equal to 2000 Mbps (Megabits Per Second), and thus, the necessity for reducing the power supply impedance is high. The inventors of the present application have studied a way in order to reduce the power supply impedance by disposing the bypass capacitor, which is connecting a power supply potential wiring and a reference potential wiring with each other, on the semiconductor chip, as shown in Patent Document 1 and Patent Document 2.

As the result of their review, if the bypass capacitor is directly soldered onto the semiconductor chip as shown in FIG. 1 of Patent Document 1, a protective film (also referred to as a passivation film) covering the main surface of the semiconductor chip may be cracked by a step of reflowing a solder material. Also, if the bypass capacitor is connected with a base material (e.g., wiring substrate) as shown in FIG. 21B of Patent Document 2, a distance between the power supply terminal and the bypass capacitor becomes long, and thus, the effect that can reduce the power supply impedance is not enough.

Other objects and novel features will become apparent from the description of this specification and the accompanying drawings.

A semiconductor device according to one embodiment, comprising: a base material having a first terminal; a semiconductor chip having a first electrode pad electrically connected with the first terminal, a second electrode pad to which a power supply potential is to be supplied, and a third electrode pad to which a reference potential is to be supplied, and mounted on the base material via a first member; a chip capacitor having a first electrode and a second electrode, and mounted on the semiconductor chip via a second member; a first wire electrically connecting the first electrode pad with the first terminal; a second wire electrically connecting the second electrode pad with the first electrode without going through the base material; a third wire electrically connecting the third electrode pad with the second electrode without going through the base material; and a resin sealing body sealing the semiconductor chip, the chip capacitor, the first wire, the second wire and the third wire. Also, a length of each of the second wire and the third wire is shorter than a length of the first wire.

According to the above-described embodiment, the power supply impedance can be reduced while preventing the occurrence of cracks in the protective film of the semiconductor chip.

DETAILED DESCRIPTION

Figure 1:
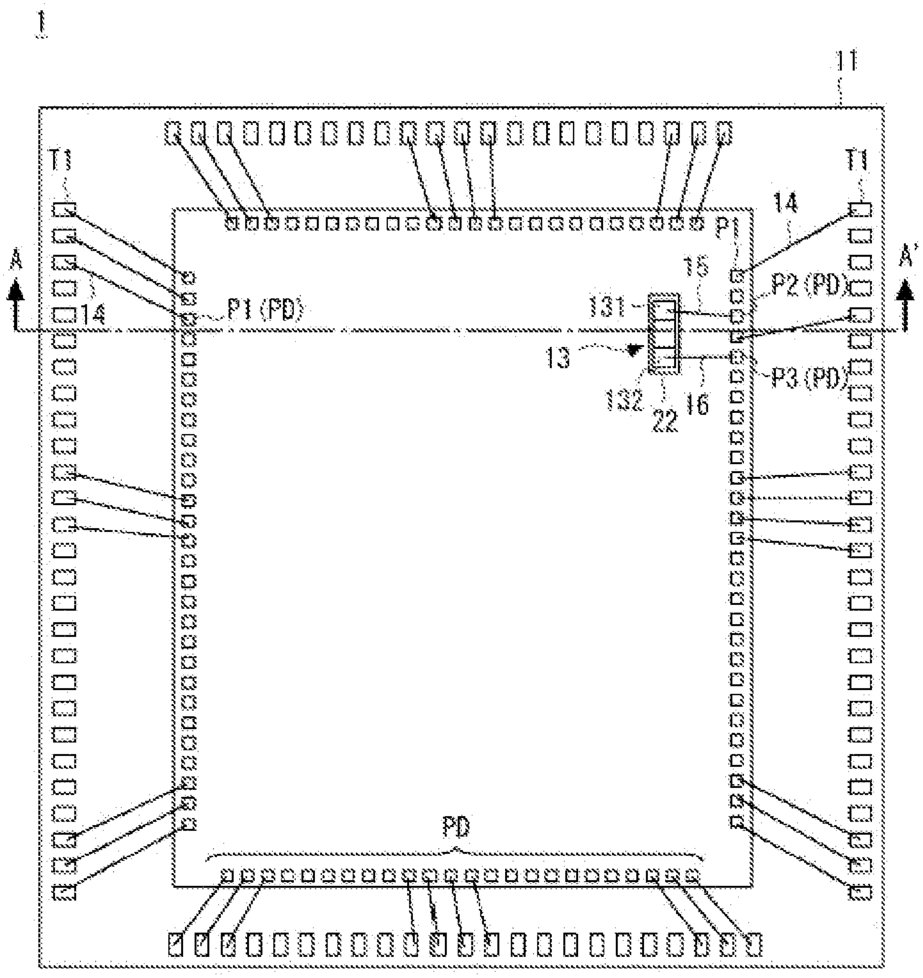
FIG. 1 is an upper surface view of a semiconductor device according to a first embodiment.

For clarity of explanation, the following description and drawings are appropriately omitted and simplified. In addition, the elements described in the drawings as functional blocks for performing various processes can be configured as CPUs (Central Processing Unit), memories, and other circuits in terms of hardware, and are realized by programs loaded into the memories in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

First Embodiment

Figure 2:
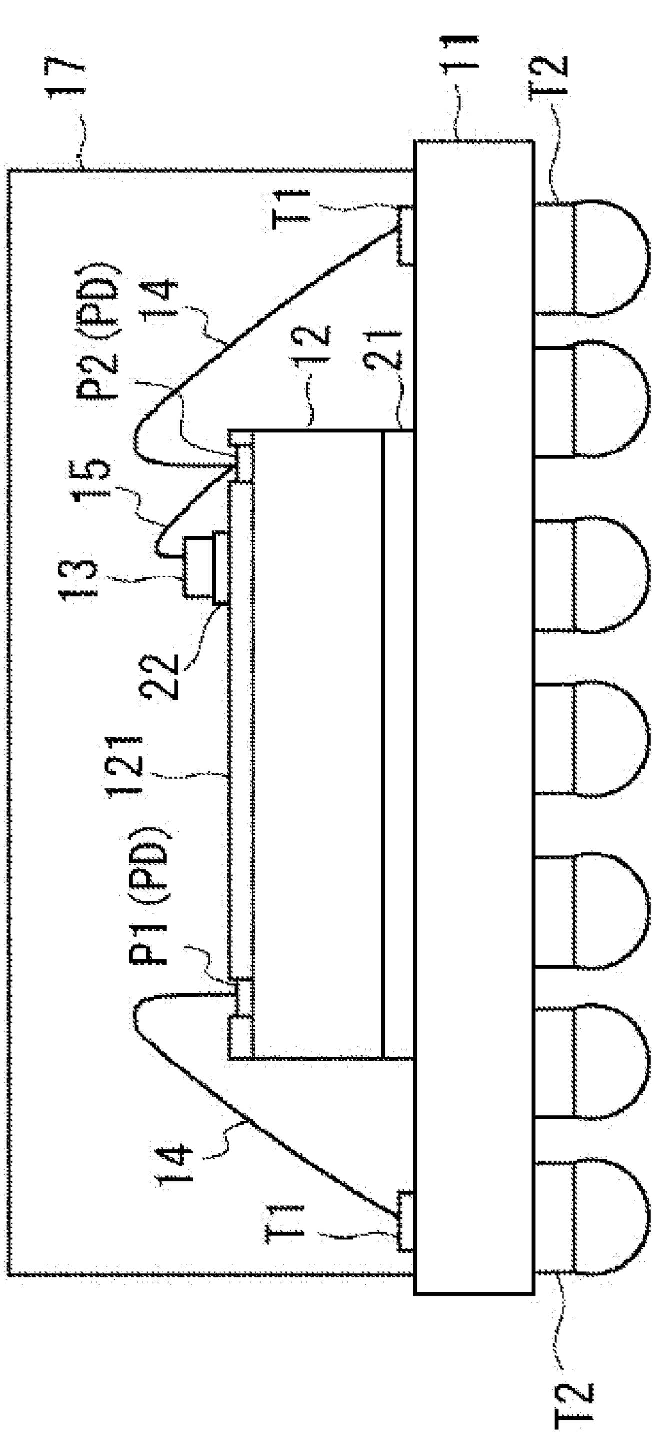
FIG. 2 is a conceptual view schematically showing a cross-section along A-A' line in FIG. 1.

FIG. 1 is an upper surface view of a semiconductor device 1 according to a first embodiment, which is seen from above. Since the semiconductor device 1 is sealed with a resin sealing body 17, a semiconductor chip 12 or the like is not actually visible from above. FIG. 2 is a conceptual view schematically showing a cross-section along A-A' line in FIG. 1. Although it is a cross-sectional view, hatching is omitted for clarity.

As shown in FIG. 2, the semiconductor device 1 includes a base material 11, the semiconductor chip 12, a chip capacitor 13, a first wire 14, a second wire 15, a third wire 16, and the resin sealing body 17.

The base material 11 is a semiconductor package substrate on which the semiconductor chip 12 is mounted. Although FIGS. 1 and 2 show that the base material 11 is BGA (Ball Grid Array) substrate, the base material 11 may be a lead frame.

As shown in FIG. 2, a first terminal T1 electrically connected to the semiconductor chip 12 is disposed on upper surface of the base material 11. The first terminal T1 includes, for example, a terminal for supplying a power source (e.g., a power source potential or a reference potential) to the semiconductor chip 12, a terminal for inputting an electric signal to the semiconductor chip 12, or a terminal for outputting an electric signal to the semiconductor chip 12. As shown in FIG. 2, a second terminal T2 electrically connected to the first terminal T1 via a wire provided between upper surface and the lower surface is disposed on the lower surface of the base material 11. An external connecting terminal (e.g., solder ball) electrically connected to the external substrate is formed on the second terminal T2.

As shown in FIG. 2, the semiconductor chip 12 is mounted on the base material 11 via a first member 21. In the present first embodiment, the first member 21 is, for example, a die attach film (DAF). The semiconductor chip 12 may be a semiconductor chip that handles high frequency signals. A semiconductor chip that handles high frequency signals is, for example, a DRAM chip (e.g., a 2000 Mbps or higher) having a high data transfer rate, or a logic chip that communicates with DRAM chip.

The semiconductor device 1 may be a SiP (System In a Package) including a plurality of semiconductor chips. The plurality of semiconductor chips may be arranged side by side or stacked vertically. Note that the chip capacitor 13 functioning as a bypass capacitor does not need to be mounted on all the semiconductor chips.

The semiconductor chip 12 includes a plurality of electrode pads PD. In the present first embodiment, the plurality of electrode pads PD is arranged along the respective sides of the semiconductor chip 12 as shown in FIG. 1. The plurality of electrode pads PD may be arranged along the respective sides of the semiconductor chip 12 and over a plurality of rows. Referring to FIG. 2, the region other than the area where the electrode pad PD is disposed is covered with a protective film 121. The protective film 121 (also referred to as a passivation film) may include, for example, a silicon oxide film and a polyimide film.

The plurality of electrode pads PD includes a first electrode pad P1, a second electrode pad P2, and a third electrode pad P3.

The first electrode-pad P1 is electrically connected to the first terminal T1. An electric signal may be inputted from the semiconductor chip 12 via the first electrode pad P1, or an electric signal may be outputted to the semiconductor chip 12, or power supply may be supplied to the semiconductor chip 12 via the first electrode pad P1.

A power supply potential is supplied to the second electrode pad P2. The second electrode pad P2 may be electrically connected to a power supply potential line provided in the semiconductor chip 12.

A reference potential is supplied to the third electrode-pad P3. The third electrode pad P3 may be electrically connected to a reference potential line provided in the semiconductor chip 12.

As described above, the plurality of electrode pads PD may be provided along each side of the semiconductor chip 12 and provided in plural rows. Here, the second electrode pad P2 and the third electrode pad P3 may be arranged in a row which is the row located at the most inner side of the semiconductor chip among the plural rows. Thus, as shown in FIG. 1, when the chip capacitor 13 is disposed in a region surrounded by a plurality of electrode pads PD on the surface of the semiconductor chip 12, the length of each of the second wire and the third wire 16 to be described later can be reduced more than the length of the first wire 14 to be described later. Here, the first electrode pad P1 may be arranged in an outer row. One of the second electrode pad P2 and the third electrode pad P3 may be disposed in an inner row, and the other may be disposed in an outer row.

As shown in FIG. 2, the chip capacitor 13 is mounted on the semiconductor chip 12 via a second member 22. In the present first embodiment, the second member 22 is, for example, a die attach film (DAF). The chip capacitor 13 includes a first electrode 131 and a second electrode 132. The chip capacitor 13 functions as a so-called bypass capacitor. The number of chip capacitors 13 may be a plurality (for example, six).

Note that the first member 21 and the second member 22 are not limited to the die attach film. The first member 21 and the second member 22 may be an adhesive or an insulating paste. However, the shape of the paste is more likely to be deformed than the die attach film during the period from applying of the paste to curing the paste. Therefore, in order to reduce the length of each of the second wire 15 and the third wire 16, when the chip capacitor 13 is disposed in the vicinity of each electrode pad P2, P3, it is preferable to use a die attach film rather than a paste.

The first wire 14 is electrically connecting the first electrode pad P1 with the first terminal T1. As a result, the base material 11 and the semiconductor chip 12 are electrically connected to each other. The metal material of the first wire 14 is not particularly limited, but is, for example, gold, copper, aluminum, or the like.

The second wire 15 is electrically connecting the second electrode pad P2 with the first electrode 131 without going through the base material 11. The metal material of the second wire 15 is not particularly limited, but is, for example, gold, copper, aluminum, or the like.

The third wire 16 is electrically connecting the third electrode pad P3 with the second electrode 132 without going through the base material 11. The metal material of the second wire 15 and the third wire 16 is not particularly limited, but is, for example, gold, copper, aluminum, or the like.

By the second wire 15 and the third wire 16, the chip capacitor 13 functions as a bypass capacitor. The chip capacitor 13 serves to reduce the power supply noise and to stabilize the power supply potential.

The resin sealing body 17 seals the semiconductor chip 12, the chip capacitor 13, the first wire 14, the second wire 15, and the third wire 16.

As shown in FIGS. 1 and 2, each of the second wire 15 and the third wire 16 is electrically connecting the chip capacitor 13 with the semiconductor chip 12 without going through the base material 11. That is, in the present first embodiment, each of the power supply potential and the reference potential is supplied (transmission) from the chip capacitor 13 to the semiconductor chip 12 without going through the base material 11. In addition, by mounting the chip capacitor 13 on the semiconductor chip 12, the length of each of the second wire and the third wire 16 can be made shorter than the length of the first wire 14 that electrically connects the base material 11 and the semiconductor chip 12 to each other. Therefore, the length of each of the second wire 15 and the third wire 16 can be reduced, and the power supply impedance can be reduced. That is, the power supply impedance in each supply path (transmission path) of the power supply potential and the reference potential from the chip capacitor 13 to the semiconductor chip 12 can be reduced. Further, since the chip capacitor 13 is not directly soldered to the semiconductor chip 12, it is possible to prevent cracks from occurring in the protective film 121.

Figure 3:
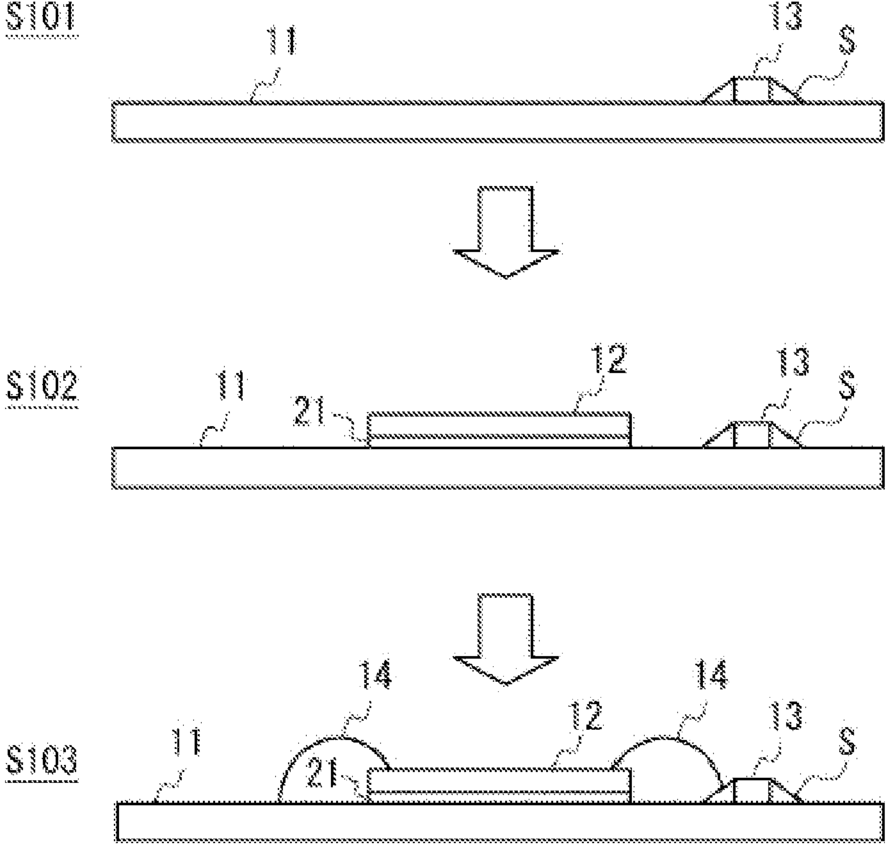
FIG. 3 is a view explaining a method of manufacturing a semiconductor device according to a related art.
Figure 4:
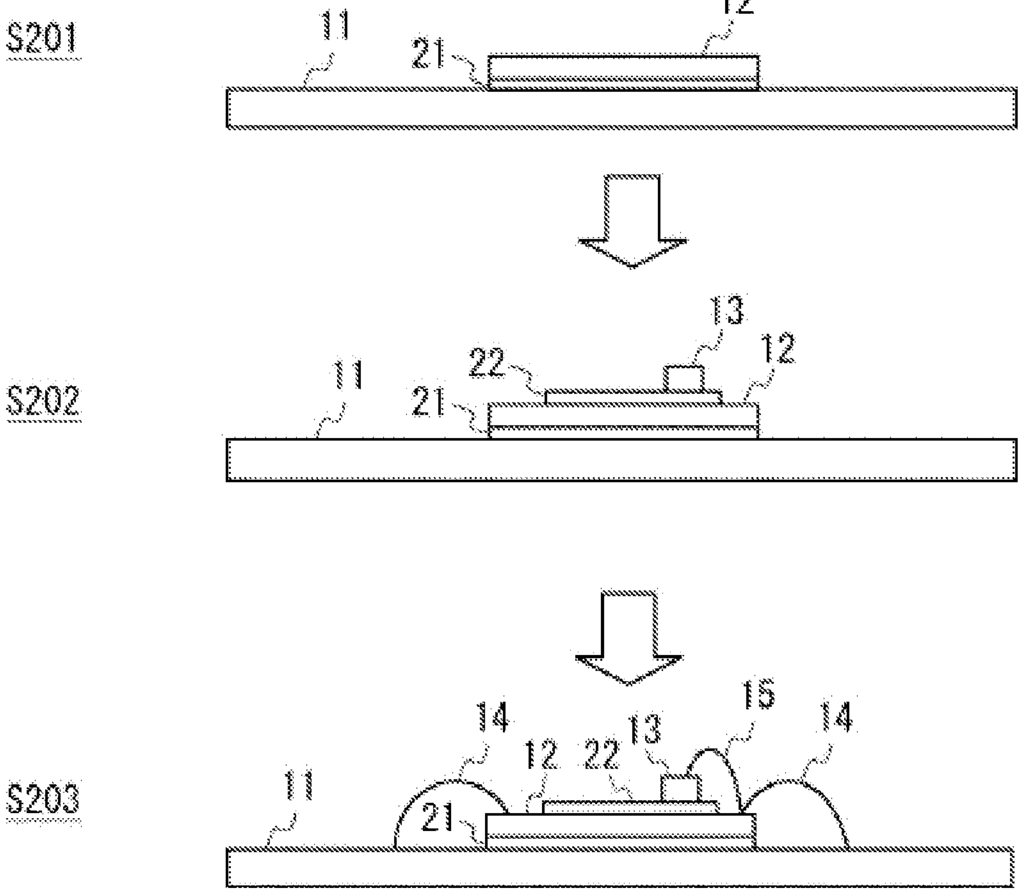
FIG. 4 is a view explaining a method of manufacturing the semiconductor device according to the first embodiment.

Now referring to FIGS. 3 and 4, a method of manufacturing the semiconductor device 1 according to the first embodiment will be described. FIG. 3 is a view explaining a method of manufacturing a semiconductor device according to a related art. FIG. 4 is a view explaining a method of manufacturing the semiconductor device according to the first embodiment.

Referring to FIG. 3, in the method of manufacturing the related semiconductor device, the chip capacitor 13 is soldered onto the base material 11 on which the power supply potential wiring (also referred to as the wiring pattern of the power supply potential) and the reference potential wiring (also referred to as the wiring pattern of the reference potential) are formed at the highest upper surface (also referred to as the top surface) by reflow (step S101). The temperature condition is set to, for example, 200 degrees Celsius to 250 degrees Celsius. The reference numeral S represents a solder.

Next, the semiconductor chip 12 is mounted on the base material 11 via the first member 21 by die bonding (step S102). The temperature condition is set to, for example, 100 degrees Celsius to 200 degrees Celsius.

Next, the semiconductor chip 12 and the base material 11 are electrically connected to each other by wire bonding (step S103).

In the related art, since the distance between the semiconductor chip 12 and the chip capacitor 13 is large, there is a problem that the power supply impedance is large. In addition, when the chip capacitor 13 is mounted outside the semiconductor chip 12, wiring resources of the base material 11 are reduced. That is, when the plurality of chip capacitors 13 are mounted on the base material 11, the uppermost upper surface of the base material 11 needs to be used for routing the power supply potential wiring and the reference potential wiring. In this case, the number of wiring layers of the base material 11 needs to be increased, for example, the number of wiring layers of the base material 11 needs to be increased from two layers to four layers.

A method of reflow soldering the chip capacitor 13 on the semiconductor chip 12 is also conceivable. However, in this case, stress may be generated in the protective film 121 of the semiconductor chip 12 due to the reflow temperature, and cracks may be generated in the protective film 121.

Referring to FIG. 4, in a method of manufacturing the semiconductor device according to the first embodiment, first, the semiconductor chip 12 is mounted on the base material 11 via the first member 21 by die bonding (step S201). The temperature condition is set to, for example, 100 degrees Celsius to 200 degrees Celsius.

Next, the chip capacitor 13 is mounted on the semiconductor chip 12 via the second member 22 by die bonding (step S202). The temperature condition is set to, for example, 100 degrees Celsius to 200 degrees Celsius.

Next, the semiconductor chip 12 and the base material 11 are electrically connected to each other by wire bonding, and the semiconductor chip 12 and the chip capacitor 13 are electrically connected to each other (step S203). Then, the semiconductor chip 12 and the like are sealed with a resin sealing body.

In the first embodiment, a S202 of steps is required, but there is an advantage that the number of interconnect layers of the base material 11 does not need to be increased. The first embodiment may be cost-effective compared to the related art.

According to the first embodiment, it is possible to reduce the power supply impedance while preventing the occurrence of cracks in the protective film of the semiconductor chip 12. In addition, the first embodiment may prevent the base material 11 from being damaged and reduce manufacturing costs.

Second Embodiment

A second embodiment is a concrete example of the first embodiment. A semiconductor device according to the second embodiment is a SiP (System In a Package) in which a DRAM (Dynamic Random Access Memory) chip 32, and a logic chip 31 that controls the DRAM chip 32 are sealed in one package. Note that the chip capacitor 13 may not be mounted on both the memory chip and the logic chip.

The logic chip 31 includes a memory controller in communication with the DRAM chip 32. The logic chip 31 may be a so-called SoC (System on a chip) in which a plurality of functions is formed into one chip.

Figure 5:
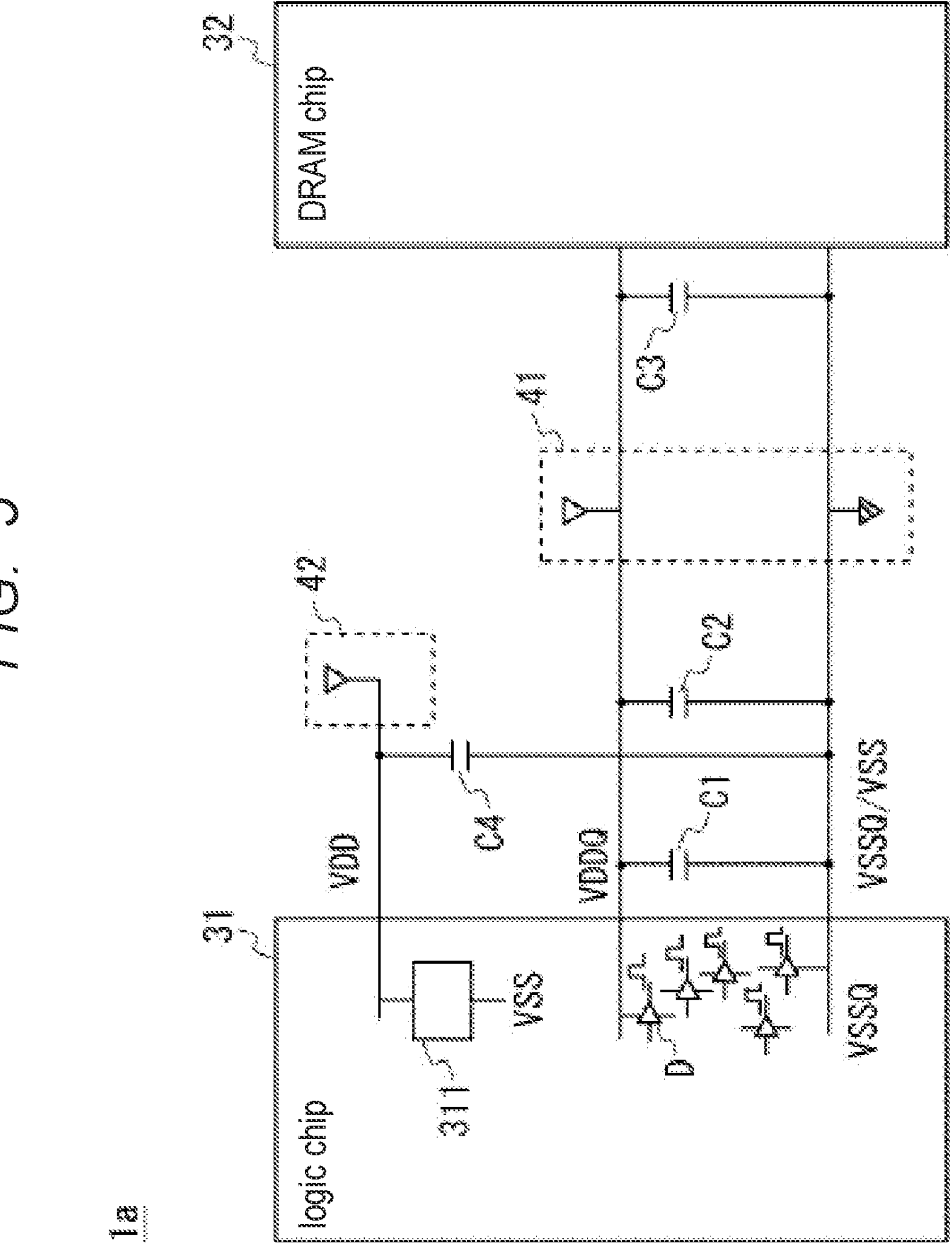
FIG. 5 is a diagram explaining a circuit configuration of a semiconductor device according to a second embodiment.

FIG. 5 is a diagram explaining a circuit configuration of the semiconductor device 1*a* according to the second embodiment. As will be described later, all of the bypass capacitors C1, C2, C3 and C4 need not be mounted as chip capacitors 13 on the logic chip 31 or on the DRAM chip 32.

The semiconductor device 1*a* includes the logic chip 31 and the DRAM chip 32. The DRAM chip 32 has a DDR_SDRAM.

The logic chip 31 includes a CPU 311 and a signaling driver D. CPU 311 is provided between the core-system power supply potential VDD and the reference potential VSS. The signal driver D is provided between DDR system power supply potential VDDQ (also referred to as DDR_VDDQ) and DDR system reference potential VSSQ (also referred to as DDR_VSSQ). The core-system power supply potential VDD, the reference potential VSS, DDR system power supply potential VDDQ, and DDR system reference potential VSSQ may be supplied from the first terminal T1 of the base material 11 described above. Further, in a path for electrically connecting the logic chip 31 and the DRAM chip 32 to each other, as shown in FIG. 5, the reference potential VSS and DDR system reference potential VSSQ may be shared with each other.

The DRAM chip 32 includes a memory cell (not shown) and an input/output circuit (not shown). The input/output circuitry is provided between DDR system power supply potential VDDQ and DDR system reference potential VSSQ. The input/output circuit reads data from the memory cell and writes data to the memory cell in response to reception of a control signal from the signal driver D.

The reference numeral 41 denotes a DDR system power supply. Each of the bypass capacitor C1 and the bypass capacitor C2 is coupled to a path for supplying DDR system power supply 41 to the logic chip 31. Each bypass capacitor C1, C2 is configured to reduce the power supply impedance seen from the logic chip 31. The bypass capacitor C1 is a small capacitance capacitor that reduces the power supply impedance in the high frequency range. The bypass capacitor C2 is a large capacitance capacitor that reduces the power supply impedance in the low frequency range.

By mounting at least one of the bypass capacitors C1 and C2 as the chip capacitor 13 on the logic chip 31, the power supply impedance of DDR power supply 41 viewed from the logic chip 31 can be reduced.

The transistors constituting the signal-driver D consume a larger driving current than the transistors constituting CPU 311. Further, there is a possibility that a plurality of signal drivers D operates simultaneously via the parallel bus interface. Therefore, a bypass capacitor C1 that reduces the power supply impedance in the high-frequency range is particularly critical because large power supply noise is generated by the transient current. Therefore, the bypass capacitor C1 among the bypass capacitors C1 and C2 is preferably mounted on the logic chip 31 as the chip capacitor 13. It should be noted that the higher the data transfer rate of the DRAM chip 32, the greater the need to lower the power supply impedance. Therefore, when the bypass capacitor C1 is mounted on the logic chip 31, the bypass capacitor C2 that reduces the power supply impedance in the low frequency range may be mounted on the base material 11 as in the related art. Further, if the length of each of the second wire 15 and the third wire 16 is the same as the length of the first wire 14 electrically connecting the logic chip 31 with the base material 11, the bypass capacitor C1, C2 may be mounted on the base material 11.

The bypass capacitor C3 is connected to a path for supplying DDR system power supply 41 to the DRAM chip 32. The bypass capacitor C3 reduces the power supply impedance as viewed from the DRAM chip 32. The bypass capacitor C3 may also include a small capacitance capacitor for removing noise in the high frequency range and a large capacitance capacitor for removing noise in the low frequency range.

By mounting the bypass capacitor C3 on the DRAM chip 32 as the chip capacitor 13, the power supply impedance of DDR power supply 41 as viewed from the DRAM chip 32 can be reduced.

The reference numeral 42 denotes a core power supply. Symbols on the negative side of the core power supply 42 are not shown. The bypass capacitor C4 is connected to a path for supplying the core-system power supply 42 to the logic chip 31. The bypass capacitor C4 lowers the power supply impedance of the core-system power supply 42 viewed from the logic chip 31.

By mounting the bypass capacitor C4 as the chip capacitor 13 on the logic chip 31, the power supply impedance of the core-system power supply 42 can be reduced. However, if the consumed current of CPU 311 is larger as the power supply impedance of the core-system power supply 42 becomes more problematic, there is a higher possibility that the logic chip 31 and the base material 11 are not connected by wires due to heat dissipation or IR dropping. In this case, the logic chip 31 may be flip chip mounted.

As described above, the bypass capacitor C1 is preferable mounted on the logic chip 31 as the chip capacitor 13. The first electrode and the second electrode of the bypass capacitor C1 are electrically connected to the second electrode pad P2 and the third electrode pad P3 of the logic chip 31, respectively. Here, the bypass capacitor C2, C3 and C4 may be mounted on the base material 11 as in the related art. When there is an area where a bypass capacitor other than the bypass capacitor C1 can be mounted on the front face of the logic chip 31, a bypass capacitor C2 that reduces the power supply impedance viewed from the logic chip 31 may also be mounted on the logic chip 31, same to the bypass capacitor C1.

Figure 6:
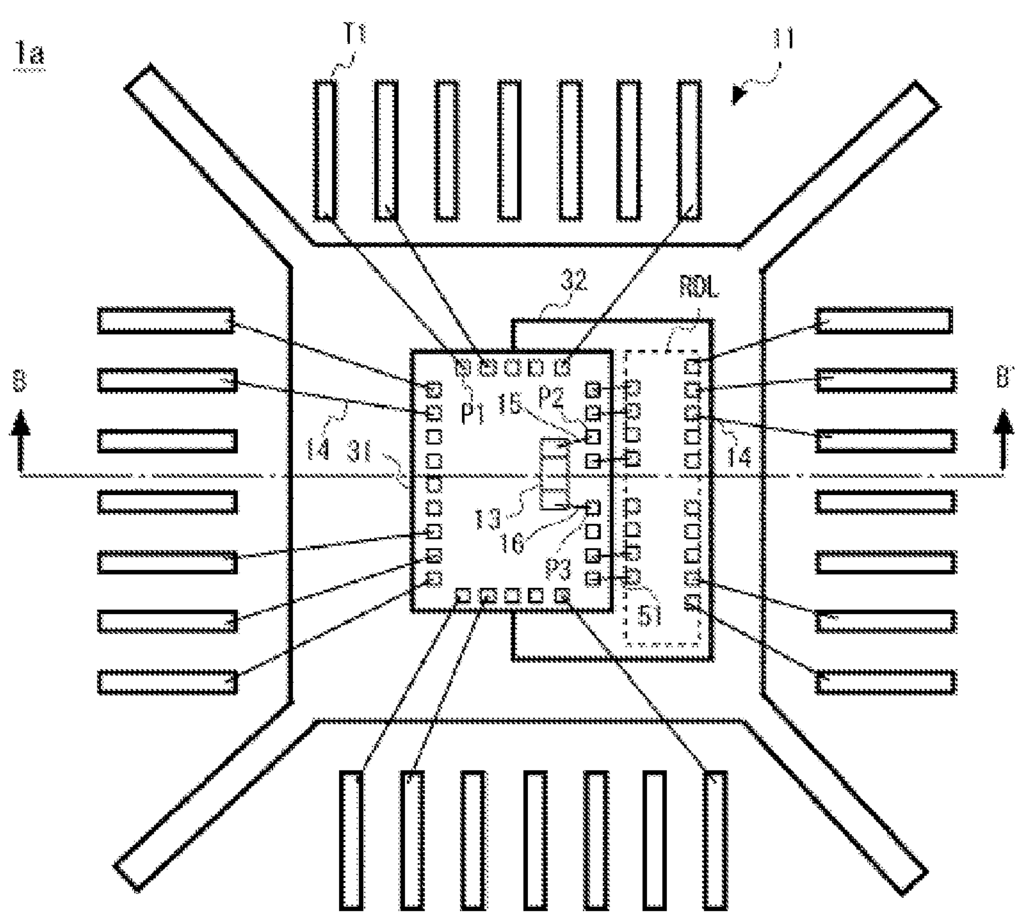
FIG. 6 is an upper surface view of the semiconductor device according to the second embodiment.
Figure 7:
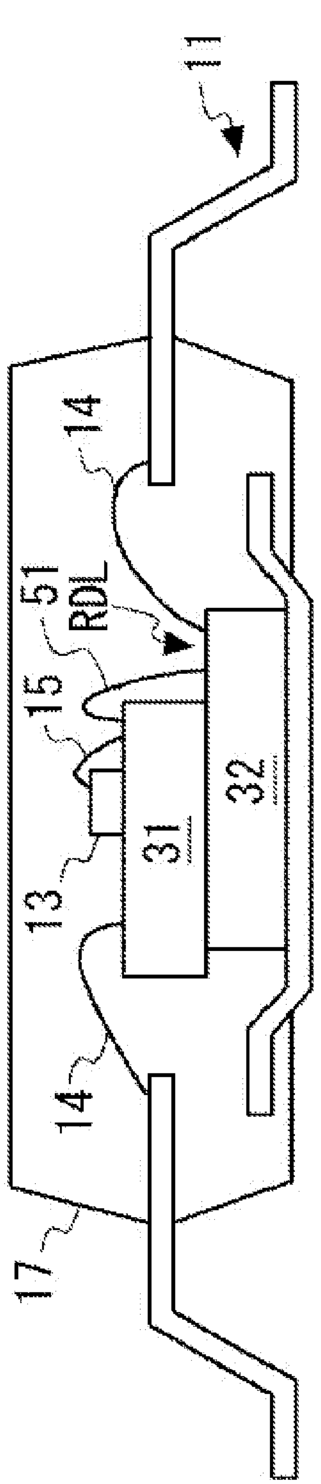
FIG. 7 is a conceptual view schematically showing a cross-section along B-B' line in FIG. 6.

Next, an exemplary configuration of the semiconductor device 1*a* according to the second embodiment will be described. FIG. 6 is an upper surface view of the semiconductor device 1*a* seen from above. FIG. 7 is a cross-sectional view along B-B' line in FIG. 6. In FIGS. 6 and 7, illustration of the first member and the second member is omitted.

FIG. 6 and FIG. 7 show a case where the chip capacitor 13 is mounted on the logic chip 31. The logic chip 31 corresponds to semiconductor chip 12 according to the first embodiment. The logic chip 31 and the DRAM chip 32 are vertically stacked. Note that the logic chip 31 may be stacked on the DRAM chip 32, and the DRAM chip 32 may be stacked on the logic chip 31.

The DRAM chip 32 is mounted on the base material 11, which is a lead frame, via a first member (not shown). When the base material 11 is a lead frame, there is a problem that the power supply impedance is higher than when the base material 11 is a BGA. The logic chip 31 is mounted on DRAM chip 32 via a first member (not shown).

The logic chip 31 and the DRAM chip 32 have the above-described first electrode pad P1. The first electrode pad P1 is an electrode pad connected to the first terminal T1 via the first wire 14. The first electrode pad P1 may be an electrode pad for inputting and outputting signals, or may be an electrode pad to which a power source (e.g., a power source potential of a DDR system power source) is supplied.

The logic chip 31 includes the second electrode pad P2 and the third electrode pad P3 described above. The second electrode pad P2 is an electrode pad connected to the first electrode P1 of the chip capacitor 13 via the second wire 15. The third electrode pad P3 is an electrode pad connected to the second electrode of the chip capacitor 13 via the third wire 16.

A redistribution layer RDL (Redistribution layer) is formed on the DRAM chip 32. DDR power source may be supplied from the base material 11 to the logic chip 31 via the first wire 14, the redistribution layers RDL, and the wire 51. The first wire 14 is a wire that electrically connects the base material 11 and the DRAM chip 32 to each other. The wire 51 is a wire that electrically connects the logic chip 31 and the DRAM chip 32 to each other. Each of the first wire 14 and the wire 51 may include a wire that transmits a signal in addition to the wire that supplies the power supply potential and the reference potential. When the logic chip 31 and the DRAM chip 32 are stacked vertically, the length of the wire 51 can be reduced.

The chip capacitor 13 may be a bypass capacitor C1 that reduces the power supply impedance in the high frequency range. Here, the bypass capacitor C2 for reducing the power supply impedance in the low frequency range may be mounted on the base material 11 as in the related art. In addition, when there is a region in which a bypass capacitor other than the bypass capacitor C1 can be mounted on the surface of the logic chip 31, the bypass capacitor C2 that reduces the power supply impedance in the low frequency region may also be mounted on the logic chip 31.

The DRAM chip 32 may also be provided with the chip capacitor 13 that functions as a bypass capacitor C3. In this case, both the power supply impedance viewed from the logic chip 31 and the power supply impedance viewed from the DRAM chip 32 can be reduced. Here, each of the logic chip 31 and the DRAM chip 32 corresponds to the semiconductor chip 12 according to the first embodiment.

Figure 8:
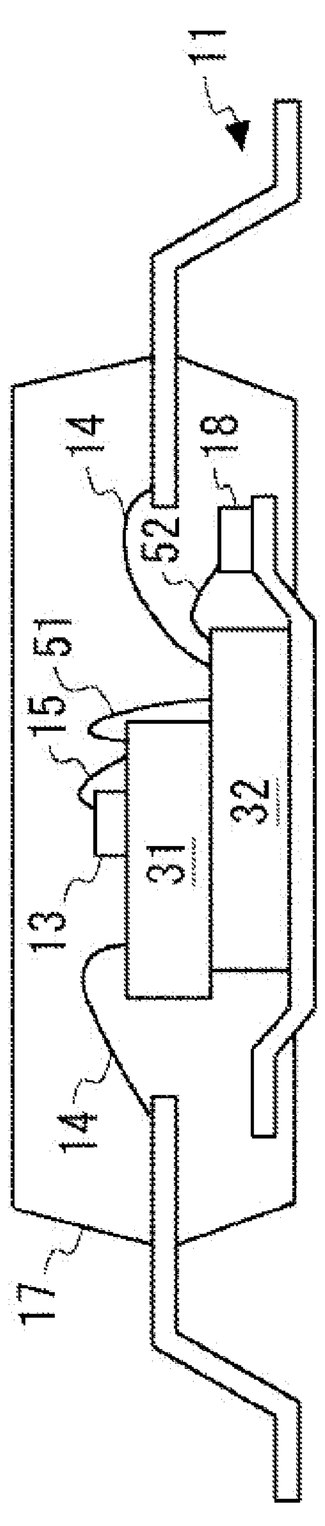
FIG. 8 is a view explaining a modified example of the semiconductor device according to the second embodiment.

FIG. 8 is a view explaining a modified example of the configuration described by referring to FIG. 6 and FIG. 7. Referring to FIG. 8, a chip capacitor 18 is mounted on the base material 11 which is a lead frame. The chip capacitor 13 mounted on the semiconductor chip 12 is also referred to as a first chip capacitor 13, and the chip capacitor 18 mounted on the base material 11 is also referred to as a second chip capacitor 18.

The second chip capacitor 18 is provided between DDR system power supply potential VDDQ supplied to the DRAM chip 32 and the reference potential VSS. As a result, the second chip capacitor 18 functions as a bypass capacitor C3.

The DRAM chip 32 has an electrode pad connected to DDR system power supply potential VDDQ and an electrode pad connected to the reference potential VSS. The second chip capacitor 18 is electrically connected to two electrode pads of the DRAM chip 32. The wire 52 is a wire connecting the second chip capacitor 18 and the DRAM chip 32. The wire 52 may be longer than the second wire 15 and the third wire 16 described above, but has an effect of reducing the power supply impedance as compared with the related art.

An area in which the first chip capacitor 13 is mounted may not be secured on the DRAM chip 32 provided below the logic chip 31. In this embodiment, the second chip capacitor 18 is provided on the base material 11, so that the power supply impedance seen from the DRAM chip 32 can be reduced.

Figure 9:
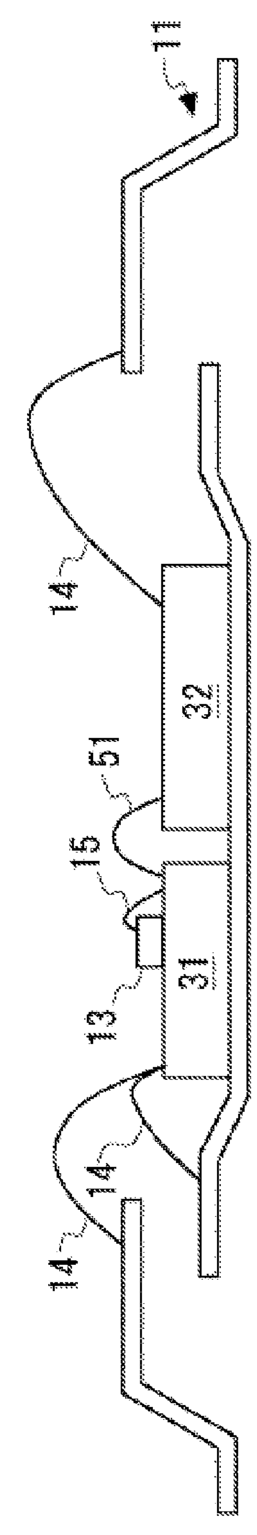
FIG. 9 is a view explaining a modified example of the semiconductor device according to the second embodiment.

In addition, the logic chip 31 and the DRAM chip 32 may be arranged side by side. FIG. 9 shows a configuration in which the logic chip 31 and the DRAM chip 32 are arranged side by side, and the chip capacitor 13 is mounted on the logic chip 31. The chip capacitor 13 may be mounted on the DRAM chip 32. The first wire 14 may include a wire connected to the die pad (e.g., a wire connected to a reference potential).

Third Embodiment

Figure 10:
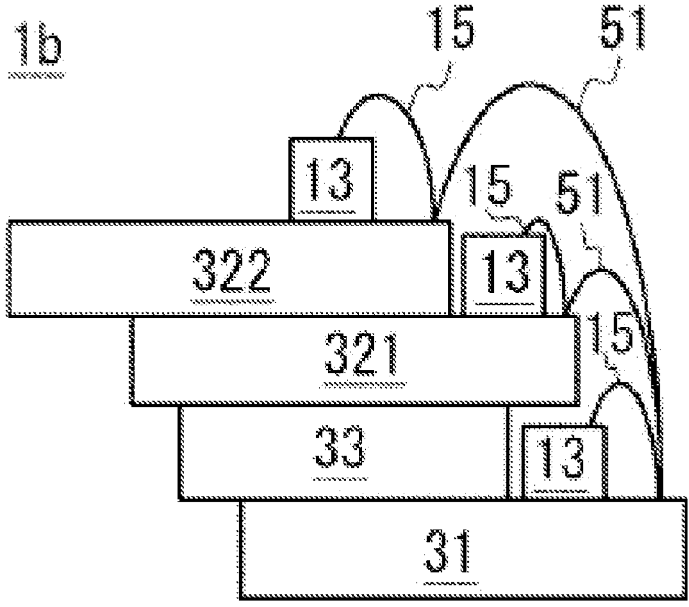
FIG. 10 is a view explaining a semiconductor device according to a third embodiment.

A third embodiment is a modified example of the second embodiment. A semiconductor device **1*b* according to the third embodiment includes a plurality of DRAM chips 32. FIG. 10 is a view explaining the semiconductor device 1*b* according to the third embodiment. In FIG. 10, an illustration of each of the base material 11**, the first member, the second member, and the like is omitted.

The semiconductor device **1*b* includes the logic chip 31 a spacer member 33, a DRAM chip 321, and a DRAM chip 322. The number of DRAM chips 32 is not limited to two, and may be three or more. Note that the logic chip 31 may be provided on the DRAM chips 321 and 322, or may be provided below the DRAM chips 321 and 322**.

SoC 31 is mounted on a substrate (not shown). A spacer member 33 is mounted on the logic chip 31. As a result, a region in which the chip capacitor 13 is mounted can be secured on the logic chip 31. The spacer member 33 may be, for example, a dummy silicon chip.

The DRAM chip 321 is mounted on the spacer member 33, and DRAM tip 322 is mounted on DRAM tip 321. DRAM chips 321 and 322 may be stacked using an adhesive film (e.g., a die attach film) or an adhesive.

The chip capacitor 13 is mounted on each of the logic chip 31, the DRAM chip 321, and the DRAM chip 322. The DRAM chip 321 is connected to the chip capacitor 13 mounted on the DRAM chip 321, and the DRAM chip 322 is connected to the chip capacitor 13 mounted on the DRAM chip 322. As a result, the power supply impedance viewed from each of the DRAM chip 321 and the DRAM chip 322 can be reduced.

Each of the logic chip 31, the DRAM chip 321, and the DRAM chip 322 has a second electrode pad and a third electrode pad (not shown). The second wire 15 electrically connects the chip capacitor 13 and the second electrode pad. A third wire (not shown) electrically connects the chip capacitor 13 and the third electrode pad.

The semiconductor device **1*b* includes a wire 51 that electrically connects the logic chip 31 and the DRAM chip 321, and a wire 51 that electrically connects the logic chip 31 and the DRAM chip 322. The wire 51 may include a wire that supplies a power supply potential and a reference potential, and control signals and data may be exchanged via the wire 51**.

In addition to the chip capacitor 13, a termination resistor for improving the signal-quality may be mounted on the DRAM chip 322. One end of the termination resistor may be electrically connected to the wire 51, and the other end of the termination resistor may be connected to a reference potential, a power supply potential, or a signal.

In the third embodiment, since a bypass capacitor is provided for each DRAM chip, the power supply impedance of each DRAM chip can be reduced.

Although the invention made by the present inventor has been specifically described based on the the embodiment, the present invention is not limited to the embodiment described above, and it is needless to say that various modifications can be made without departing from the gist thereof.

For example, in the voltage dividing circuit according to the above-described embodiment, a configuration may be adopted in which a conductivity type (p-type or n-type) such as a semiconductor substrate, a semiconducting layer, or a diffusion layer (diffusion region) is inverted. Therefore, in the case where one of the conductivity types of the n-type or the p-type is the first conductivity type and the other conductivity type is the second conductivity type, the first conductivity type can be the p-type and the second conductivity type can be the n-type, or on the contrary, the first conductivity type can be the n-type and the second conductivity type can be the p-type.

In the above-described embodiments, the chip capacitor 13 is mounted on the semiconductor chip 12 via the die attach film 22. However, as shown in FIG. 11, another BGA substrate 61 may be mounted on the die attach film 22 disposed on the semiconductor chip 12, and the chip capacitor 13 may be mounted on the another BGA substrate 61 via the solder material 62.

Figure 11:
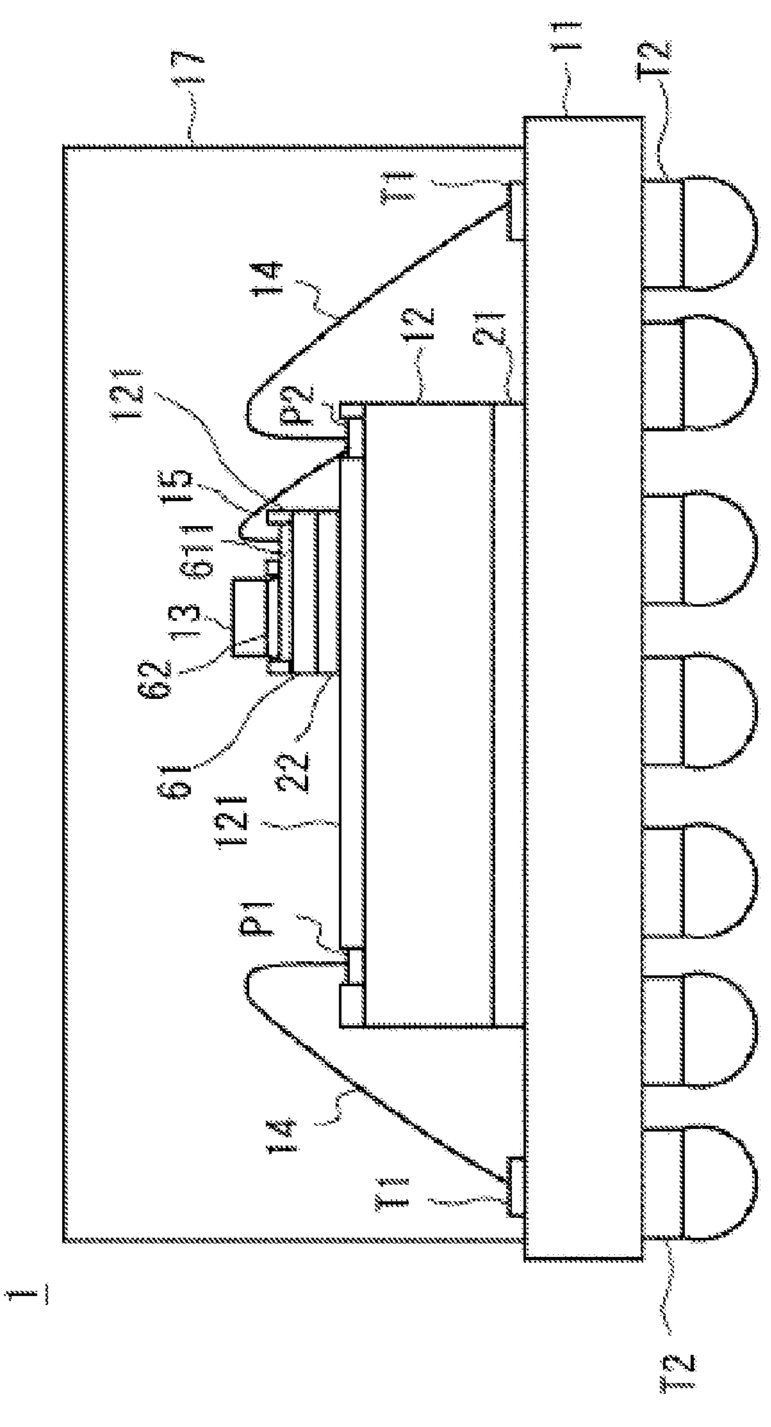
FIG. 11 is a view explaining a modified example of the semiconductor device according to each embodiment.

In the configuration shown in FIG. 11, the respective electrodes 131 and 132 of the chip capacitor 13 and the respective wires (terminals) 611 of BGA substrate 61 are electrically connected to each other via the solder material 62, but since not only the die attach film 22 but also another BGA substrate 61 is interposed between the chip capacitor 13 and the semiconductor chip 12, the above-described cracks can be suppressed from occurring in the protective film 121 formed on the surface (upper surface) of the semiconductor chip 12.

Further, in order to reliably suppress the crack, it is preferable that the thickness of the other BGA substrate 61 or the die attach film 22 to be used is relatively large. However, if the thickness of the other BGA substrate 61 or the die attach film 22 is too large, the length of the wires that electrically connect the wires (terminals) 611 of the other BGA substrate 61 and the electrode-pad P2, P3 of the semiconductor chip 12 to each other becomes long. That is, the lengths of the supply paths (transmission paths) of the power supply potential and the reference potential from the chip capacitor 13 to the semiconductor chip 12 become longer. Further, the number of manufacturing steps of the semiconductor device increases as compared with the use of the other BGA substrate 61 or the soldering material 62, for example, the first embodiment described above. Therefore, when the power supply impedance in the supply path (transmission path) of each of the power supply potential and the reference potential from the chip capacitor 13 to the semiconductor chip 12 is also reduced while the manufacturing cost of the semiconductor device is reduced, it is preferable not to use another BGA substrate 61 as in the above-described embodiments.

What is claimed is:

1. A semiconductor device comprising:

a base material having a first terminal;

a semiconductor chip having a first electrode pad electrically connected with the first terminal, a second electrode pad to which a power supply potential is to be supplied, and a third electrode pad to which a reference potential is to be supplied, and mounted on the base material via a first member;

a chip capacitor having a first electrode and a second electrode, and mounted on the semiconductor chip via a second member;

a first wire electrically connecting the first electrode pad with the first terminal;

a second wire electrically connecting the second electrode pad with the first electrode without going through the base material;

a third wire electrically connecting the third electrode pad with the second electrode without going through the base material; and a resin sealing body sealing the semiconductor chip, the chip capacitor, the first wire, the second wire and the third wire, wherein a length of each of the second wire and the third wire is shorter than a length of the first wire, wherein the power supply potential is to be supplied from the chip capacitor to the semiconductor chip without going through the base material, and wherein the reference potential is to be supplied from the chip capacitor to the semiconductor chip without going through the base material.

2. The semiconductor device according to claim 1, further comprising:

a DRAM chip; and a logic chip controlling the DRAM chip, wherein at least one of the DRAM chip and the logic chip is provided as the semiconductor chip having a surface on which the chip capacitor is mounted.

3. The semiconductor device according to claim 2, wherein one of the DRAM chip and the logic chip is provided as the semiconductor chip having the surface on which the chip capacitor is mounted, and wherein another of the DRAM chip and the logic chip is provided as another semiconductor chip having a surface on which another chip capacitor is mounted.

4. The semiconductor device according to claim 2, wherein the logic chip is provided as the semiconductor chip having the surface on which the chip capacitor is mounted, wherein the chip capacitor mounted on the logic chip is configured to reduce a power supply impedance in a high frequency range seen from the logic chip, and wherein another chip capacitor mounted on the base material is configured to reduce a power supply impedance in a low frequency range seen from the logic chip.

5. The semiconductor device according to claim 2, wherein one semiconductor chip of the DRAM chip and the logic chip is stacked on another semiconductor chip of the DRAM chip and the logic chip, wherein the one semiconductor chip is provided as the semiconductor chip having the surface on which the chip capacitor is mounted, and wherein the another semiconductor chip is coupled with another chip capacitor mounted on the base material.

6. The semiconductor device according to claim 2, further comprising:

a plurality of DRAM chips stacked, wherein the chip capacitor is mounted on each DRAM chip.

7. The semiconductor device according to claim 2, wherein a data transfer rate of the DRAM chip is 2000 Mbps or more.

8. The semiconductor device according to claim 1, wherein, in plan view, a plurality of electrode pads including the first electrode pad, the second electrode pad and the third electrode pad is arranged along each side of the semiconductor chip and arranged in plural rows, and wherein each of the second electrode pad and the third electrode pad is arranged in a first row, the first row is a row located at the most inner side of the semiconductor chip among the plural rows in plan view.

9. The semiconductor device according to claim 1, wherein the second member is a die attach film.

* * * * *